(12) United States Patent
Tanabe

(10) Patent No.: US 10,274,546 B2
(45) Date of Patent: Apr. 30, 2019

(54) BATTERY DEGRADATION MONITORING SYSTEM

(71) Applicant: MITSUBISHI JIDOSHA KOGYO KABUSHIKI KAISHA, Tokyo (JP)

(72) Inventor: Toshiya Tanabe, Okazaki (JP)

(73) Assignee: MITSUBISHI JIDOSHA KOGYO KABUSHIKI KAISHA, Tokyo (JP)

( * ) Notice: Subject to any disclaimer, the term of this patent is extended or adjusted under 35 U.S.C. 154(b) by 1061 days.

(21) Appl. No.: 14/527,844

(22) Filed: Oct. 30, 2014

(65) Prior Publication Data

US 2015/0120226 A1 Apr. 30, 2015

(30) Foreign Application Priority Data

Oct. 31, 2013 (JP) ................................. 2013-226692

(51) Int. Cl.
*G01R 31/36* (2006.01)
*G01K 13/00* (2006.01)

(52) U.S. Cl.
CPC ......... *G01R 31/3679* (2013.01); *G01K 13/00* (2013.01); *G01R 31/3606* (2013.01); *G01R 31/3648* (2013.01)

(58) Field of Classification Search
CPC ............ G01R 31/3679; G01R 31/3648; G01R 31/3606; G01K 13/00
See application file for complete search history.

(56) References Cited

U.S. PATENT DOCUMENTS

2003/0231006 A1* 12/2003 Tojima ............... G01R 31/3679
320/132
2007/0285060 A1 12/2007 Zettel et al.
(Continued)

FOREIGN PATENT DOCUMENTS

DE 10 2012 000 847 A1 7/2012
JP 9-293539 A 11/1997
(Continued)

OTHER PUBLICATIONS

Qian et al., "Temperature Effect on Electric Vehicle Battery Cycle Life in Vehicle-to-Grid Applications", 2010 China International Conference on Electricity Distribution, pp. 1-6.*
(Continued)

*Primary Examiner* — Regis J Betsch
*Assistant Examiner* — Jeremy Delozier
(74) *Attorney, Agent, or Firm* — Birch, Stewart, Kolasch & Birch, LLP

(57) ABSTRACT

In a battery degradation monitoring system provided with a battery monitoring unit including a temperature sensor for detecting the ambient temperature of a battery mounted on a vehicle and a clock function unit to compute the state of charge and the degradation rate of the battery as a whole by inputting the voltages and temperatures of a plurality of battery modules of the battery from cell monitoring units when an ignition switch of the vehicle is on, the battery monitoring unit is further actuated by the clock function unit each time a predetermined period of time elapses when the ignition switch of the vehicle is off to integrate a degradation function formula with respect to the ambient temperature detected by the temperature sensor and compute the degradation rate of the battery when the ignition switch is off.

15 Claims, 3 Drawing Sheets

(56) References Cited

U.S. PATENT DOCUMENTS

2011/0004428 A1* 1/2011 Murochi ............ G01R 31/3679
702/63
2012/0310571 A1 12/2012 Takagi
2013/0271148 A1* 10/2013 Maeda ................. B60L 3/0046
324/426

FOREIGN PATENT DOCUMENTS

| JP | 2008-24124 A | 2/2008 |
|----|--------------|--------|
| JP | 2013-181875 A | 9/2013 |

OTHER PUBLICATIONS

European Search Report dated Mar. 20, 2015 issued in corresponding European Application No. 14 19 0612.3.
Japanese Office Action of JP 2014-198744 dated Jul. 4, 2018.
Japanese Decision of Refusal and English translation for Application No. 2014-198744, dated Feb. 6, 2019.

\* cited by examiner

BATTERY DEGRADATION MONITORING SYSTEM

BACKGROUND OF THE INVENTION

Field of the Invention

The present invention relates to a system for monitoring the degradation of a battery and a technique of computing the rate of degradation when the battery is left to stand.

Description of the Related Art

Recently-developed hybrid vehicles and plug-in hybrid vehicles are equipped with large-capacity batteries (secondary battery cells) as traveling and driving power sources. Since a battery degrades and the capacity thereof decreases due to use, there is a need to understand the degradation rate of the battery.

The degradation rate of the battery is computed on the basis of, for example, the amount of discharge of the battery and the integrated value of battery temperature (see Japanese Patent Laid-Open No. 2013-181875).

The battery degrades, however, depending on elapsed time and temperature not only when in use but also when not subjected to current input/output like when a vehicle is left unattended. Accordingly, the degradation rate may vary greatly according to temperature change if, for example, the vehicle is not used and left unattended for a prolonged period of time.

The system described in the abovementioned patent publication detects and integrates the amount of discharge of a battery and battery temperature at predetermined time intervals, in order to calculate the degradation rate of the battery. Accordingly, the power supplies of current and temperature detection means and an arithmetic device have to be kept turned on. The system therefore consumes electrical power and is suited neither for long-term monitoring nor for monitoring when a vehicle is left unattended in particular.

SUMMARY OF THE INVENTION

Hence, an object of the present invention is to provide a battery degradation monitoring system capable of monitoring the degradation rate of a battery, while suppressing electrical power consumption, even when a vehicle is left unattended for a prolonged period of time.

In order to achieve the above-described object, a battery degradation monitoring system according to the present invention for monitoring a state of degradation of a battery mounted on a vehicle is provided with a temperature sensing unit for detecting an ambient temperature of the battery; a clock function unit for measuring time; and a monitoring unit actuated by the clock function unit each time a predetermined period of time elapses after the ignition switch of the vehicle is turned off to compute a degradation rate of the battery on the basis of a temperature change over the predetermined period of time from the ambient temperature detected by the temperature sensing unit when the monitoring unit is actuated by the clock function unit to the ambient temperature detected when the monitoring unit is actuated the last time.

Consequently, when the ignition switch is off, the monitoring unit is actuated by the clock function unit at predetermined time intervals and the ambient temperature of the battery is detected by the temperature sensing unit.

Since the electrical power consumption of the battery is suppressed when the ignition switch is turned off, the state of charge remains substantially unchanged. Accordingly, when the ignition switch is off, the degradation rate of the battery can be computed on the basis of a change in the ambient temperature of the battery detected by the temperature sensing unit each time the predetermined period of time elapses.

In addition, the electrical power consumption can be suppressed since the monitoring unit has only to be actuated each time the predetermined period of time elapses when the degradation rate is computed with the ignition switch turned off. Consequently, it is possible to monitor the degradation of the battery, while suppressing the electrical power consumption, even if the vehicle is left unattended for a prolonged period of time.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION OF THE INVENTION

Hereinafter, embodiments of the present invention will be described with reference to the accompanying drawings.

Figure 1:
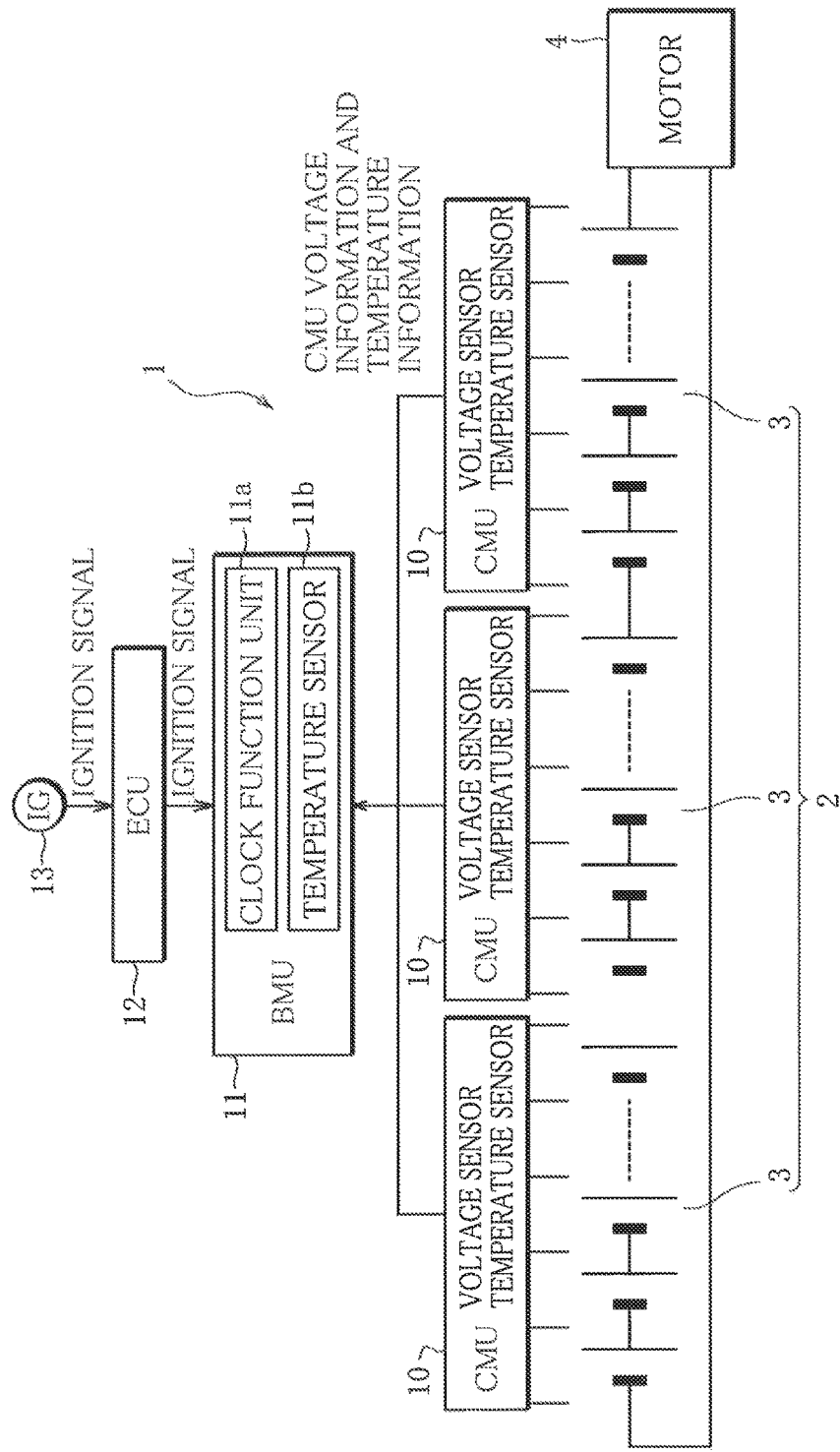
FIG. 1 is a block diagram illustrating the configuration of a battery degradation monitoring system according to one embodiment of the present invention.

FIG. 1 is a block diagram illustrating the configuration of a battery degradation monitoring system according to one embodiment of the present invention.

A battery degradation monitoring system 1 of the present embodiment is adopted in vehicles, such as plug-in hybrid vehicles, hybrid vehicles and electric vehicles, equipped with a comparatively large-capacity traveling and driving battery 2 (battery cell).

As illustrated in FIG. 1, the traveling and driving battery 2 mounted on a vehicle is composed of secondary batteries, such as lithium-ion batteries, and includes a plurality of battery modules 3 configured by combining a plurality of battery cells. The battery modules 3 are connected in series, so as to be able to supply electrical power to a vehicle traveling and driving motor 4.

Each battery module 3 is provided with a cell monitoring unit (CMU) 10 including a sensor for detecting the temperature and voltage of the battery module 3 and having the function of monitoring the voltage and the like of each battery module 3.

Each cell monitoring unit 10 outputs voltage information and temperature information to a battery monitoring unit (BMU) 11.

The battery monitoring unit 11 contains a clock function unit 11$a$ for measuring time and a temperature sensor 11$b$ (temperature sensing unit). The temperature sensor 11$b$ can detect ambient temperature and outputs the temperature as the ambient temperature of the battery 2. In addition, the battery monitoring unit 11 is provided with a storage device (such as a ROM, a RAM or a non-volatile RAM), a central processing unit (CPU), and the like.

The battery monitoring unit 11 has the function of inputting voltage information and temperature information from each cell monitoring unit 10 to compute a state of charge SOC and a degradation rate Y of the battery 2 as a whole.

The state of charge SOC is computed using, for example, a map in which states of charge SOC corresponding to the voltages of respective battery modules 3 are stored. The state of charge SOC may be evaluated on the basis of the integrated value of currents input to and output from the battery module 3.

The battery monitoring unit 11 and the cell monitoring units 10 are put in operation by an on-state (ON) signal of an ignition switch (IG) 13 of the vehicle input from an electrical control unit 12 for controlling the vehicle as a whole.

In addition, the battery monitoring unit 11 can be operated by being actuated by the built-in clock function unit 11a at a preset time interval of to even if the ignition switch 13 is in an off state (OFF).

Figure 2:
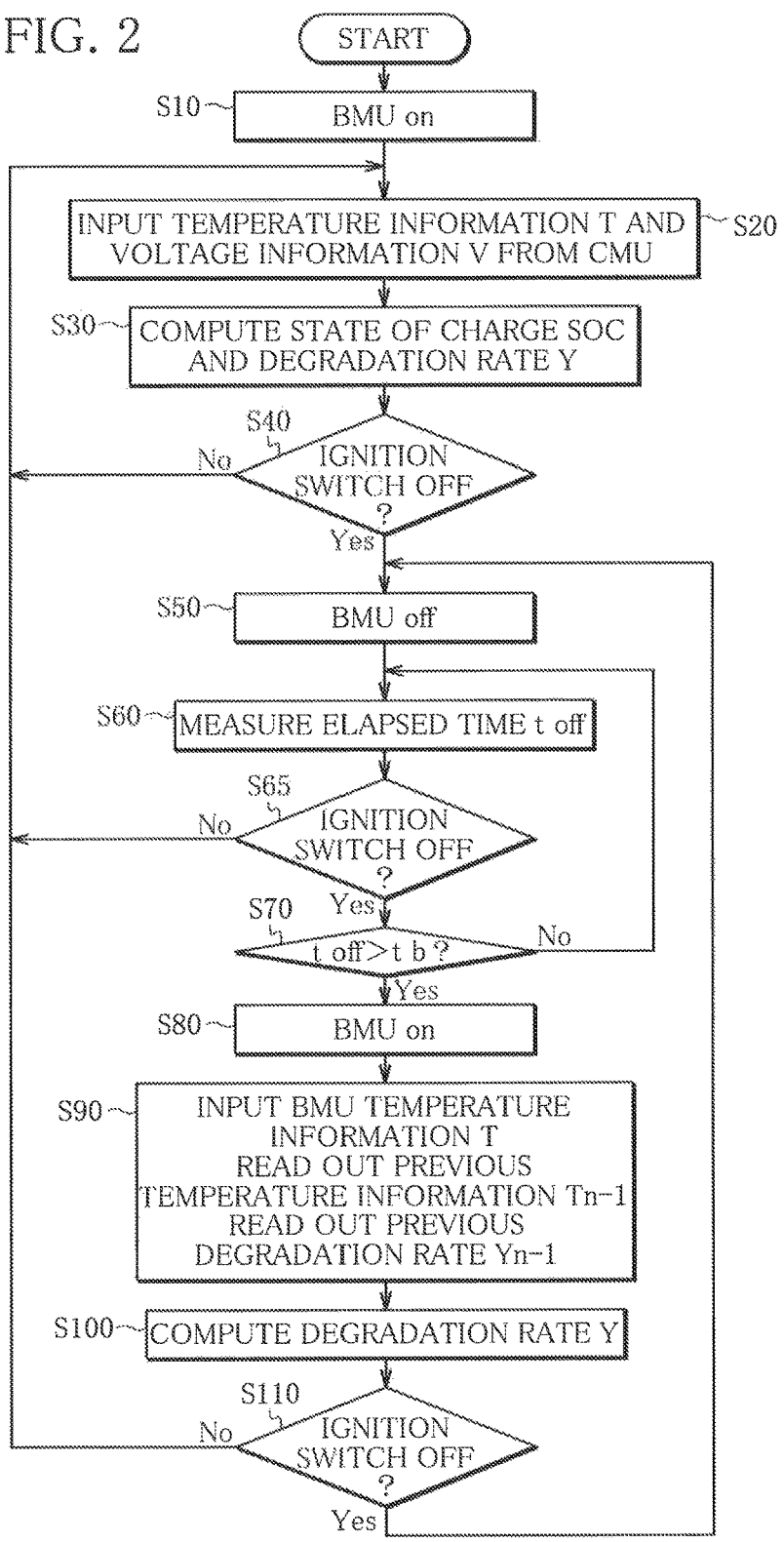
FIG. 2 is a flowchart illustrating a method for computing the degradation rate of a battery using a battery monitoring unit according to the present embodiment.
Figure 3:
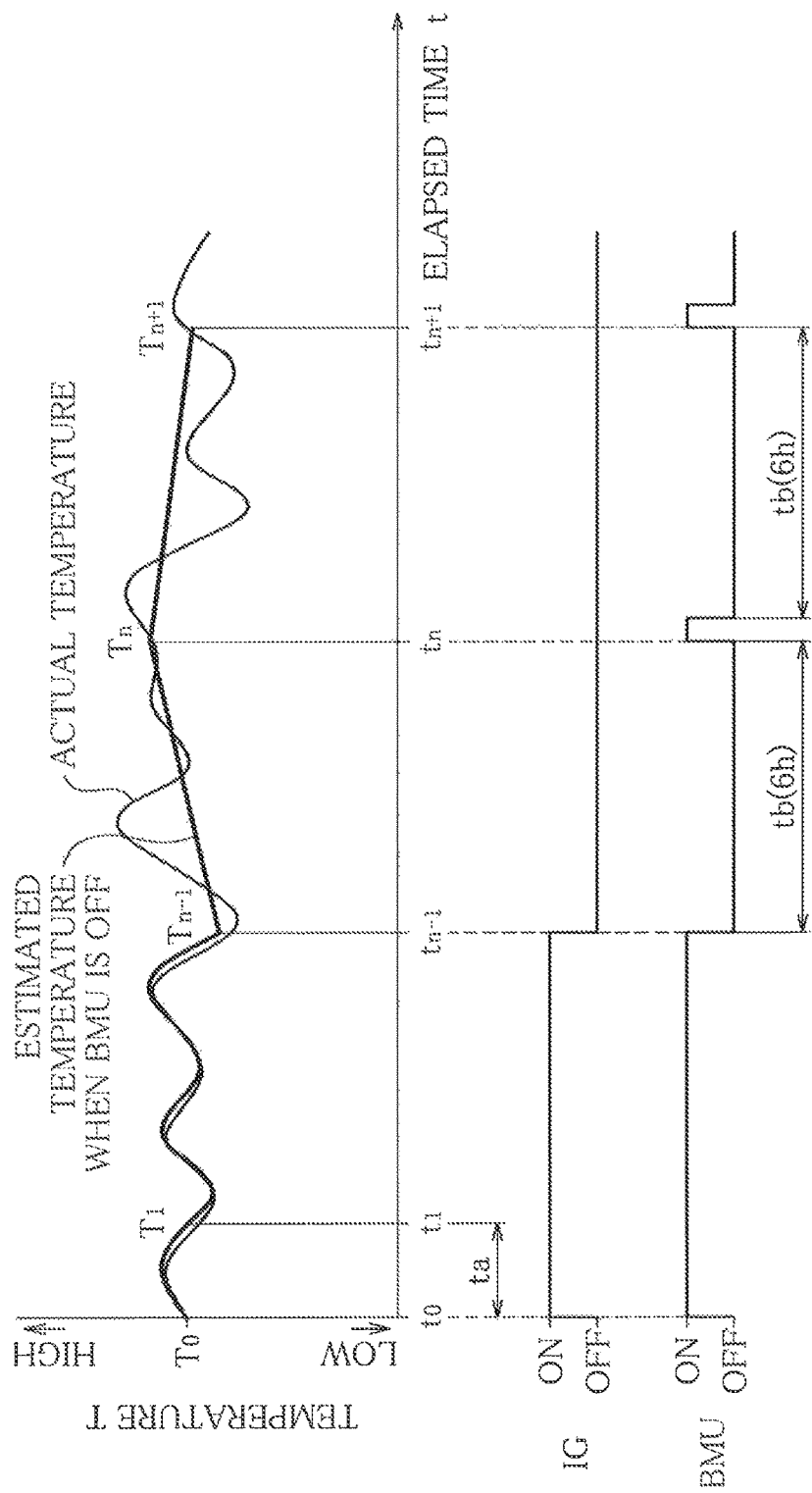
FIG. 3 is a timing chart used to describe the method for computing the degradation rate of a battery.

FIG. 2 is a flowchart illustrating a method for computing the degradation rate of the battery 2 using the battery monitoring unit 11 according to the present embodiment. FIG. 3 is a timing chart used to describe the method for computing the degradation rate of the battery 2. FIG. 3 illustrates the on and off states of the battery monitoring unit 11, the transition of actual temperature of the battery 2, and the estimated temperature of the battery 2 in an off state of the battery monitoring unit 11, when the ignition switch 13 is switched from an on state to an off state.

This control is initiated by inputting the on-state signal of the ignition switch 13.

As illustrated in FIG. 2, the battery monitoring unit 11 is turned on first in step S10. Then, the system goes to step S20.

In step S20, temperature information (temperature T) and voltage information (voltage V) are input from each cell monitoring unit 10. Then, the system goes to step S30.

In step S30, the state of charge SOC and the degradation rate Y of the battery 2 as a whole are computed on the basis of temporal information (elapsed time t) measured by the built-in clock function unit 11a and temperature information (temperature T) and voltage information (voltage V) input in step S20.

The state of charge SOC of the battery 2 as a whole is computed using a map in which states of charge SOC corresponding to voltages V are stored. Alternatively, the state of charge SOC may be evaluated after inputting and averaging the voltages of respective battery modules 3 from the cell monitoring units 10. Yet alternatively, the state of charge SOC may be evaluated on the basis of the integrated value of currents input to and output from the battery 2.

The degradation rate Y is represented as a ratio of capacity decreased due to degradation since shipment to capacity at the time of shipment. For example, the degradation rate Y at the time of shipment is 0. The degradation rate Y is evaluated by Equation 1 shown below:

$$Y = \sum_{n=1}^{n} Y_n = \sum_{n=1}^{n} \int_{t_{n-1}}^{t_n} \int_{T_{n-1}}^{T_n} \int_{SOC_{n-1}}^{SOC_n} \{f(t, T, SOC)\} dsoc\, dT dt \quad \text{(Equation 1)}$$

As shown in Equation 1 given above, the degradation rate Y is a value to which an increment in the degradation rate per a time ta evaluated by integrating an increment in the degradation rate per unit time, unit temperature and unit state of charge determined by a computing equation f (t, T, SOC) (corresponding to the degradation function formula in the present invention) with respect to the time t, the temperature T and the state of charge SOC is add. The time ta here is a short length of time, such as several msec or several sec. Here, the computed state of charge SOC and degradation rate Y are stored in a memory within the battery monitoring unit 11, so as to overwrite previous computed values. Then, the system goes to step S40.

In step S40, a discrimination is made whether or not the ignition switch 13 is turned off. If the ignition switch 13 is off, the system goes to step S50. If the ignition switch 13 is on, the system returns to step S20.

In step S50, the battery monitoring unit 11 is turned off. Note that the clock function unit 11a within the battery monitoring unit 11 continues to operate at this time. Then, the system goes to step S60.

In step S60, a measurement is made of a time toff elapsed from when the battery monitoring unit 11 is turned off. The time toff elapsed from when the battery monitoring unit 11 is turned off is measured by the clock function unit 11a within the battery monitoring unit 11. Then, the system goes to step S65.

In step S65, a discrimination is made whether or not the ignition switch 13 is turned off. If the ignition switch 13 is off, the system goes to step S70. If the ignition switch 13 is on, the system returns to step S20.

In step S70, a discrimination is made whether or not the elapsed time toff measured in step S60 is longer than a predetermined time tb. The predetermined time tb may be set to a time, for example, six hours defined by dividing one day into several time slots. If the elapsed time toff is longer than the predetermined time tb, the system goes to step S80. If the elapsed time toff is shorter than the predetermined time tb, the system returns to step S60.

In step S80, the battery monitoring unit 11 is actuated (turned on). Then, the system goes to step S90.

In step S90, temperature information T is input from the temperature sensor 11b built in the battery monitoring unit 11. In addition, a degradation rate $Y_{n-1}$ which is the previous computed value stored in the memory and temperature $T_{n-1}$ computed the last time are read out. Then, the system goes to step S100.

In step S100, the degradation rate Y is computed on the basis of the previous temperature $T_{n-1}$ and degradation rate $Y_{n-1}$ input in step S90.

The degradation rate Y here is evaluated by Equation 2 shown below:

$$Y = \sum_{n=1}^{n} Y_n = \sum_{n=1}^{n} \int_{t_{n-1}}^{t_n} \int_{T_{n-1}}^{T_n} \{f(t, T)\} dT dt \quad \text{(Equation 2)}$$

As shown in Equation 2 given above, the degradation rate Y is a value to which an increment in the degradation rate at each time of actuation evaluated by integrating an increment in the degradation rate per unit time and unit temperature determined by a computing equation f (t, T) (corresponding to the degradation function formula in the present invention) with respect to the time t and the temperature T is add. Since the ignition switch 13 is off here, the state of charge SOC does not vary but remains at a substantially constant value. Equation (2) therefore differs from Equation (1) given above in that the state of charge SOC is not integrated. Note that as illustrated in FIG. 3, a temperature change within the predetermined time tb is estimated to make a linear transition from the temperature $T_{n-1}$ detected when the battery monitoring unit 11 is actuated the last time to temperature T, detected this time. In addition, the degradation rate Y and the temperature T computed here are overwritten to supersede previous values and stored in the memory within the battery monitoring unit 11. Then, the system goes to step S110.

In step S110, a discrimination is made whether or not the ignition switch 13 is turned off. If the ignition switch 13 is off, the system returns to step S50. If the ignition switch 13 is on, the system returns to step S20.

By controlling the system as described above in the present embodiment, the voltage V and the temperature T are input from the cell monitoring units 10 at an interval of, for example, several msec (t1, t2, t3 . . . ) to compute the degradation rate Y (Y1, Y2, Y3 . . . ) when the ignition switch 13 is on, since the battery monitoring unit 11 and the cell monitoring units 10 are on. The degradation rate Y is integrated at predetermined time intervals, and this integrated value corresponds to a degradation rate at a given time point. When the ignition switch 13 is on, a current may be output from the battery 2 due to the use of the motor 4 or the like. It is possible to accurately compute the state of charge SOC and the degradation rate Y, however, since the voltage of each battery module 3 is detected by a cell monitoring unit 10 at an interval of the time ta.

In the present embodiment, the degradation rate Y of the battery 2 is computed even when the ignition switch 13 is off. When the ignition switch 13 is off, the battery monitoring unit 11 is actuated at an interval of the predetermined time tb (for example, six hours) to detect the temperature T using the temperature sensor 11b built in the battery monitoring unit 11. Thus, the degradation rate is computed on the basis of this temperature T.

Specifically, a value obtained by integrating f (t, T) with respect to the time t and the temperature T over the predetermined time tb corresponds to an increment in the degradation rate produced during the predetermined time tb, when the ignition switch 13 is in an off state in which a variation in the state of charge SOC of the battery 2 is marginal. Since the temperature T is estimated to change linearly within the predetermined time tb, from the temperature $T_{n-1}$ detected the last time to the temperature $T_n$ detected this time, there is no need to successively detect temperature within the predetermined time tb. It is therefore possible to actuate the battery monitoring unit 11 only at an interval of the predetermined time tb to detect temperature and compute the increment in the degradation rate. It is thus possible to add the increment in the degradation rate to the previous degradation rate $Y_{n-1}$ stored in the memory to compute the current degradation rate Y.

In the present embodiment, the degradation rate Y resulting from the integration of an increment in the degradation rate when the ignition switch is on is evaluated by Equation 1, and the degradation rate Y resulting from the integration of an increment in the degradation rate when the ignition switch is off is evaluated by Equation 2. Since a vehicle is cycled between alternating on and off-states of the ignition switch, each state being set for any period of time, since shipment, the overall degradation rate of the battery 2 since shipment is a value obtained by alternately adding the degradation rate Y resulting from the integration of an increment in the degradation rate when the ignition switch is on and evaluated by Equation 1 and the degradation rate Y resulting from the integration of an increment in the degradation rate when the ignition switch is off and evaluated by Equation 2. That is, it is possible to evaluate an increment in the degradation rate of the battery 2 from the initial point of time up to the present.

For example, the current degradation rate Y of the battery 2 when the ignition switch is off is computed by adding an increment in the degradation rate Y computed when the ignition switch is turned off to the degradation rate Y computed and stored in the memory when the ignition switch is turned on immediately before.

Note that the memory may be divided into two memories, a first memory and second memory to store the integrated value of an increment in the degradation rate when the ignition switch is on in the first memory and the integrated value of an increment in the degradation rate when the ignition switch is off in the second memory. Then, the overall degradation rate of the battery 2 since shipment may be evaluated by summing the integrated value of an increment in the degradation rate when the ignition switch is on stored in the first memory and the integrated value of an increment in the degradation rate when the ignition switch is off stored in the second memory.

As described above, in the present embodiment, the battery monitoring unit 11 is actuated at an interval of the predetermined time tb to make it possible to compute the degradation rate of the battery 2 which changes along with a temperature change when the ignition switch 13 is off. Since the clock function unit 11a and the temperature sensor 11b are built in the battery monitoring unit 11, the degradation rate Y of the battery 2 can be computed by actuating only the battery monitoring unit 11 at an interval of the predetermined time tb when the ignition switch 13 is off. Thus, it is possible to suppress electrical power consumption.

In addition, in the present embodiment, the degradation rate Y when the ignition switch 13 is off is evaluated by adding an increment in the degradation rate Y computed on the basis of the ambient temperature T when the ignition switch 13 is off to a precise degradation rate Y computed when the ignition switch 13 is turned on the last time. Consequently, the degradation rate of the battery 2 can be computed more precisely than computing the degradation rate Y on the basis of the ambient temperature T over the entire period using the battery monitoring unit 11.

Yet additionally, in the present embodiment, the predetermined time tb is set to six hours, i.e., the predetermined time tb is set so that temperature is detected four times a day when the ignition switch 13 is off. Consequently, it is possible to reflect values close to the maximum temperature and the minimum temperature during a day in detected values of temperature, while suppressing electrical power consumption by suppressing the frequency of detection.

As described above, in the present embodiment, it is possible to accurately monitor the degradation of the battery 2, while suppressing the consumption of electrical power, even if a vehicle is left unattended for a prolonged period of time.

It should be noted that the present invention is not limited the above-described embodiment. For example, the predetermined time tb which is the interval of actuating the battery monitoring unit 11 may be set to another value as appropriate. Alternatively, the predetermined time tb may be set so that the battery monitoring unit 11 is actuated at times of a day at which the temperature is maximum and minimum.

In the above-described embodiment, the clock function unit 11a and the temperature sensor 11b are built in the battery monitoring unit 11. Alternatively, however, the clock function unit 11a and the temperature sensor 11b may be disposed separately from the battery monitoring unit 11.

Also in the above-described embodiment, the degradation rate Y when the ignition switch is on is evaluated by Equation 1 shown above, and the degradation rate Y when the ignition switch is off is evaluated by Equation 2. Alternatively, however, the degradation rates Y may be evaluated by Equation 1 both when the ignition switch is on and when the ignition switch is off. In this case, Equation 1 may be computed with the understanding that the state of charge SOC remains unchanged and constant in value when the ignition switch is off. In this way, the degradation rate Y can be calculated using the same degradation function formula (Equation 1) both when the ignition switch is on and when the ignition switch is off. It is therefore possible to simplify control in the battery monitoring unit 11.

Also in the above-described embodiment, the degradation rate Y at the time of shipment is defined as 0. Even if the degradation rate Y at the time of shipment is not 0, however, the current degradation rate Y of the battery 2 is computed by adding the degradation rate Y resulting from the integration of an increment in the degradation rate evaluated by Equation 1 or 2 to the degradation rate Y at the time of shipment. That is, it is possible to evaluate an increment in the degradation rate of the battery 2 from the initial point of time up to the present, as in the above-described embodiment.

In the present embodiment, the present invention is applied to the battery 2 utilized as the traveling and driving power source of a vehicle. It is possible, however, to widely apply the present invention to batteries mounted on vehicles.

What is claimed is:

1. A battery degradation monitoring system for monitoring a state of degradation of a battery, including a plurality of battery modules, mounted on a vehicle, the system comprising:
    an ambient temperature sensor that detects an ambient temperature of the battery;
    a clock that measures time;
    a cell monitoring device provided for each battery module and including a voltage sensor that detects a voltage of the battery module and a temperature sensor, provided separate from the ambient temperature sensor, that detects a temperature of the battery module, the cell monitoring device being turned on when an ignition switch is turned on and turned off when the ignition switch is turned off,
    a monitoring device that calculates a degradation rate of a capacity of the battery due to degradation of the battery, the monitoring device being turned off when an ignition switch of the vehicle is turned off, the monitoring device including,
    a processor and a storage storing instructions that cause the processing device to:
    when the ignition switch is turned on,
        calculate a state of charge of each battery module based on the voltage detected by the voltage sensor,
        calculate the degradation rate of the battery based on the detected temperature of each battery module and the calculated state of charge of each battery module, and
        integrating the calculated degradation rate of the battery during the ignition switch is turned on, and
    when the ignition switch is turned off,
        repeatedly actuate the monitoring device without turning on the cell monitoring device when the clock measures a predetermined period after an ignition switch of the vehicle is turned off and each time the clock measures the predetermined time thereafter, and
        calculate when the monitoring device is actuated each time the predetermine time elapses, the degradation rate of the battery based on a difference between a current ambient temperature and an ambient temperature detected when the monitoring device is actuated the last time, and
        integrating the calculated degradation rate of the battery during the ignition switch is turned off,
    turn off the monitoring device each time the calculation step is completed, wherein
    the battery is replaced based on the calculated degradation rate of the battery during the ignition switch is turned on and the calculated degradation rate during the ignition switch is turned off.

2. The battery degradation monitoring system according to claim 1, wherein the monitoring device integrates a degradation function formula, which is a function formula used to evaluate the degradation rate, at least on the basis of a change in the ambient temperature over the predetermined period of time, and computes an increment in the degradation rate within the predetermined period of time on the basis of the evaluated degradation rate.

3. The battery degradation monitoring system according to claim 2, wherein the monitoring device computes the state of charge and the degradation rate of the battery when the ignition switch of the vehicle is on from the voltage and temperature of the battery and, when the ignition switch is turned off, adds the increment in the degradation rate computed when the ignition switch is off to the degradation rate computed when the ignition switch is turned on the last time, thereby computing the current degradation rate of the battery.

4. The battery degradation monitoring system according to claim 3, wherein the current degradation rate of the battery computed by the monitoring device is a value obtained by adding an increment in the degradation rate of the battery up to the present to the degradation rate of the battery at the time of shipment of the vehicle.

5. The battery degradation monitoring system according to claim 2, wherein the degradation function formula is a function formula for computing an increment in the degradation rate per unit time, the unit temperature of the ambient temperature and the unit state of charge of the battery, and the monitoring device computes the increment in the degradation rate by integrating the degradation function formula with respect to an elapsed time, the ambient temperature and the state of charge of the battery when the ignition switch of the vehicle is on, and computes the increment in the degradation rate by integrating the degradation function formula with respect to the elapsed time and the ambient temperature by regarding the amount of change in the state of charge as 0 when the ignition switch of the vehicle is off.

6. The battery degradation monitoring system according to claim 3, wherein the degradation function formula is a function formula for computing an increment in the degradation rate per unit time, the unit temperature of the ambient temperature and the unit state of charge of the battery, and the monitoring device computes the increment in the degradation rate by integrating the degradation function formula with respect to an elapsed time, the ambient temperature and the state of charge of the battery when the ignition switch of the vehicle is on, and computes the increment in the degradation rate by integrating the degradation function formula with respect to the elapsed time and the ambient temperature by regarding the amount of change in the state of charge as 0 when the ignition switch of the vehicle is off.

7. The battery degradation monitoring system according to claim 4, wherein the degradation function formula is a function formula for computing an increment in the degradation rate per unit time, the unit temperature of the ambient temperature and the unit state of charge of the battery, and the monitoring device computes the increment in the degradation rate by integrating the degradation function formula with respect to an elapsed time, the ambient temperature and the state of charge of the battery when the ignition switch of the vehicle is on, and computes the increment in the degradation rate by integrating the degradation function formula with respect to the elapsed time and the ambient temperature by regarding the amount of change in the state of charge as 0 when the ignition switch of the vehicle is off.

8. The battery degradation monitoring system according to claim 1, wherein the predetermined period of time is six hours.

9. The battery degradation monitoring system according to claim 2, wherein the predetermined period of time is six hours.

10. The battery degradation monitoring system according to claim 3, wherein the predetermined period of time is six hours.

11. The battery degradation monitoring system according to claim 4, wherein the predetermined period of time is six hours.

12. The battery degradation monitoring system according to claim 5, wherein the predetermined period of time is six hours.

13. The battery degradation monitoring system according to claim 6, wherein the predetermined period of time is six hours.

14. The battery degradation monitoring system according to claim 7, wherein the predetermined period of time is six hours.

15. The battery degradation monitoring system according to claim 1, wherein the degradation rate of a capacity of the battery indicates a degradation of the battery since shipment of a new battery.

* * * * *